United States Patent [19]
Bertagnolli et al.

[11] Patent Number: 5,741,733
[45] Date of Patent: Apr. 21, 1998

[54] METHOD FOR THE PRODUCTION OF A THREE-DIMENSIONAL CIRCUIT ARRANGEMENT

[75] Inventors: Emmerich Bertagnolli; Helmut Klose, both of München, Germany

[73] Assignee: Siemens Aktiengesellschaft, Munich, Germany

[21] Appl. No.: 676,164

[22] PCT Filed: Jan. 12, 1995

[86] PCT No.: PCT/DE95/00031

§ 371 Date: Jul. 15, 1996

§ 102(e) Date: Jul. 15, 1996

[87] PCT Pub. No.: WO95/19642

PCT Pub. Date: Jul. 20, 1995

[30] Foreign Application Priority Data

Jan. 14, 1994 [DE] Germany ............... 44 00 985.2

[51] Int. Cl.⁶ ............... H01L 21/84; H01L 21/00
[52] U.S. Cl. ............... 438/152; 438/406; 438/401; 438/459
[58] Field of Search ............... 437/915, 225, 437/205; 438/152, 406, 401, 459

[56] References Cited

U.S. PATENT DOCUMENTS 4,902,637  2/1990  Konduo et al. ............... 437/915

FOREIGN PATENT DOCUMENTS

| 0 238 089 | 9/1987 | European Pat. Off. | |
| 63-174308 | 7/1988 | Japan | 437/915 |
| 1-253228 | 11/1989 | Japan | 437/915 |
| 94-25981 | 11/1994 | WIPO | 437/915 |

OTHER PUBLICATIONS

Wolf et al, Silicon Processing For The VLSI Era, vol. 1, Process Technology, Lattice Press, pp. 182–195, 1986.

Ghandi, Sorab K., VLSI Fabrication Principles Silicon and Gallium Arsenide, John Wiley and Sons, Inc., pp. 587–613, 646–653, 1994.

T. Kunio et al., "Three Dimensional Ics, Having Four Stacked Active Device Layers", International Electron Devices meeting, Technical Digest, 1989, pp. 837–840. Month Unknown.

K. Oyama et al., "High Density Dual–Active–Device–Layer(Dual)–CMOS Structure With Vertical Tungsten Plug–In Wirings", International Electron Devices meeting, Technical Digest, 1990, pp. 59–62. Month Unknown.

Y. Hayashi et al., "Fabrication of Three–Dimensional IC Using Cumulatively Bonded IC (Cubic) Technology", 1990 Symposium on VLSI Technology pp. 95–96. Month Unknown.

Japanese Abstract, Semiconductor Device, S. Jiyunji, Publication number JP59155951, Publication date May 9, 1984, vol. 9, No. 8.

Japanese Abstract, M. Mitsuo, "Three–Dimensional Semiconductor Integrated Circuit", Publication Number JP63213943, Publication date Jun. 9, 1988, vol. 13, No. 2.

*Primary Examiner*—Jey Tsai
*Assistant Examiner*—Michael S. Lebentritt
*Attorney, Agent, or Firm*—Hill & Simpson

[57] ABSTRACT

To produce a three-dimensional circuit arrangement, a first substrate (1) is thinned, stacked onto a second substrate (2) and fixedly connected to the latter. The first substrate (1) and the second substrate (2) in this case each comprise circuit structures (12, 22) and metallization planes (13, 23). At least one first contact hole (16) and one second contact hole (4) are opened, which reach the metallization plane (13, 23) in the first substrate (1) and second substrate (2), respectively, the second contact hole (4) passing through the first substrate (1). The metallization planes (13, 23) of the two substrates (1, 2) are electrically connected to one another via a conductive layer (7).

26 Claims, 4 Drawing Sheets

METHOD FOR THE PRODUCTION OF A THREE-DIMENSIONAL CIRCUIT ARRANGEMENT

BACKGROUND OF THE INVENTION

1. Field of the Invention

In planar technology, which is chiefly used nowadays for semiconductor circuits, the integration level that can be achieved on a chip is limited by the size of the chip, on the one hand, and by the structural fineness that can be achieved, on the other hand. The performance of a system which is realized using planar technology and which comprises a plurality of chips connected to one another is limited by the number of possible connections between individual chips via connection contacts, the signal transmission speed that can be achieved via such connections (the so-called frequency performance), and also by the power consumption.

2. Description of the Related Art

The use of three-dimensional circuit arrangements has been proposed (see, for example, the publication by T. Kunio et al., IEDM '89, p. 837 or K. Oyama et al., IEDM '90, p.59) in order to overcome these restrictions. A plurality of chip planes are arranged one above the other in the three-dimensional circuit arrangements. The necessary electrical connections between the chip planes are produced by making direct contact.

In order to produce three-dimensional integrated circuits, it is known (see, for example, the publication by T. Kunio et al., IEDM '89, p. 837 or K. Oyama et al., IEDM '90, p.59) to deposit a further semiconductor layer on a substrate in which a plane of components has been produced. This semiconductor layer is recrystallized by laser annealing, for example. A further component plane is then realized in the recrystallized layer. The components produced in the substrate prior to the deposition of the further semiconductor layer are exposed, during the recrystallization step to the thermal loading associated with the laser annealing, which leads to a very limited yield for the chips due to large numbers of defects which occur.

In order to produce a three-dimensional integrated circuit arrangement, it is known, from the publication by Y. Hayashi et al. Syrup. VLSI Technol. 1990, p. 95, first to produce the individual component planes separately from one another in different substrates. These substrates are then thinned to a few μm in thickness and are connected to one another with the aid of the wafer bonding method. For the electrical connection of the various component planes, the thinned substrates are provided on their front and rear sides with contacts for subsequent interchip connections. This has the disadvantage that the thinned wafers have to be processed on both the front and rear sides. However, rear side processes are not provided in the standard planar technology. A number of handling problems remain unsolved in connection with this method. A further disadvantage of the known method is that the functionality of the individual component planes cannot easily be tested before they are joined together, since individual components, but not complete circuits, are realized in each individual plane.

In both of the known methods, the components and the three-dimensional circuit arrangement are essentially produced at the same time, with the result that the method must be carried out by a chip manufacturer.

SUMMARY OF THE INVENTION

The present invention is based on the problem of providing a method for the production of a three-dimensional circuit arrangement in which the production of individual components can take place independently of the construction of the three-dimensional circuit arrangement.

This problem is solved according to the invention by a method for the production of a three-dimensional circuit arrangement,

- in which a first substrate, which comprises, in the region of a first main area, at least one first circuit structure, a first metallization plane and a first passivation layer which covers the first metallization plane, is connected to an auxiliary substrate via a first adhesion layer which is applied to the first main area,
- in which the first substrate is thinned at a second main area opposite to the first main area,
- in which a second substrate, which comprises, in the region of a third main area, at least one second circuit structure, a second metallization plane and a second passivation layer which covers the second metallization plane, is provided with a second adhesion layer on the third main area,
- in which the first substrate and the second substrate are joined together in such a way that the second main area of the first substrate adjoins the second adhesion layer on the second substrate, and that the first substrate and the second substrate are fixedly connected via the second adhesion layer,
- in which a first contact hole is opened from the first main area to the first metallization plane,
- in which, after the removal of the auxiliary substrate and of the first adhesion layer, at least one second contact hole is opened to the second metallization plane starting from the first main area, and
- in which a conductive layer is produced on the first main area and electrically connects the first metallization plane and the second metallization plane to one another.

The method is further characterized by side insulation being produced on the side walls of at least the second contact hole prior to the production of the conductive layer. The first substrate and the second substrate may each be provided with alignment marks which are used to effect alignment using infrared transmitted light when the first substrate and the second substrate are joined together. The first substrate may be thinned by grinding and/or etching.

In one embodiment, the method provides that
- at least the first substrate is an SOI substrate which comprises a monocrystalline silicon layer, a buried $SiO_2$ layer and a silicon wafer,
- the silicon wafer is removed during the thinning of the first substrate, and
- the first circuit structure is realized in the monocrystalline silicon layer of the SOI substrate.

A further passivation layer may be applied to the whole area of the conductive layer. Further metallization planes can be arranged in the first substrate, under the first metallization plane, and/or in the second substrate, under the second metallization plane. Disclosed embodiments provide that the first adhesion layer is formed from a polyimide or a polyacrylate and is removed with the aid of $O_2$ plasmas or by wet-chemical means. The second adhesion layer is formed from a polyimide which is cured by polymerization after the first substrate and the second substrate have been joined together.

To open the second contact hole, combined etching which comprises at least isotropic etching using HNO3/HF and anisotropic etching using an HBr plasma is used. Alternately, the second contact hole is opened using anisotropic etching using CHF3 and HBr plasmas.

In the method according to the present invention, two finished processed substrates, which each comprise circuit structures and metallization planes, are connected to one another by means of an adhesion layer. The upper substrate has in this case been previously thinned from the rear side. Starting at the surface of the upper substrate, contact holes are opened to a metallization plane of the upper substrate and a metallization plane of the lower substrate. The contact hole, which reaches the metallization plane of the lower substrate, in this case completely passes through the upper substrate. A conductive layer is subsequently applied to the surface of the upper substrate and establishes an electrical connection between the metallization planes of the two substrates via the contact holes.

Suitable substrates for the present method includes monocrystalline silicon substrates, SOI substrates or substrates of different technology families, such as III-V semiconductors, for example. A double or generally multiple layer structure produced by the method according to the invention is likewise suitable as a substrate, with the result that the method according to the present invention is suitable for producing a three-dimensional circuit arrangement with as many component planes as desired. The use of an SOI substrate as the upper substrate has the advantage that when the upper substrate is thinned, the buried oxide layer of the SOI substrate can be used as a stop layer.

A suitable adhesion layer for the fixed connection between the adjacent substrates is, for example, a polyimide which is cured by polymerization.

Apart from the thinning of the respective upper substrate and the joining together of the substrates, the method according to the invention only uses process steps which are introduced and are known from planar technology. Since exotic process steps are dispensed with, large yields are achieved by the method according to the invention.

In order to align the substrates relative to one another when they are being joined together, it lies within the scope of the invention to provide the substrates in each case with alignment marks, by means of which an alignment of the substrate is carried out using infrared transmitted light.

It lies within the scope of the invention to apply a further passivation layer to the whole area of the conductive layer, in which further passivation layer it is possible to open connection openings to the metallization planes of the substrates and/or the conductive layer and/or to further conductive structures or metallization planes in the substrates, depending on the requirement of the application.

In practice, the production of the contact hole to the metallization plane of the lower substrate requires etching to a depth which is much greater than the diameter of the contact hole. Anisotropic etching processes using CHF3 and HBr plasmas are particularly suitable for this purpose.

BRIEF DESCRIPTION OF THE DRAWINGS

The invention is explained in more detail below with reference to the figures and using an exemplary embodiment.

DETAILED DESCRIPTION OF THE PREFERRED EMBODIMENTS

Figure 1:
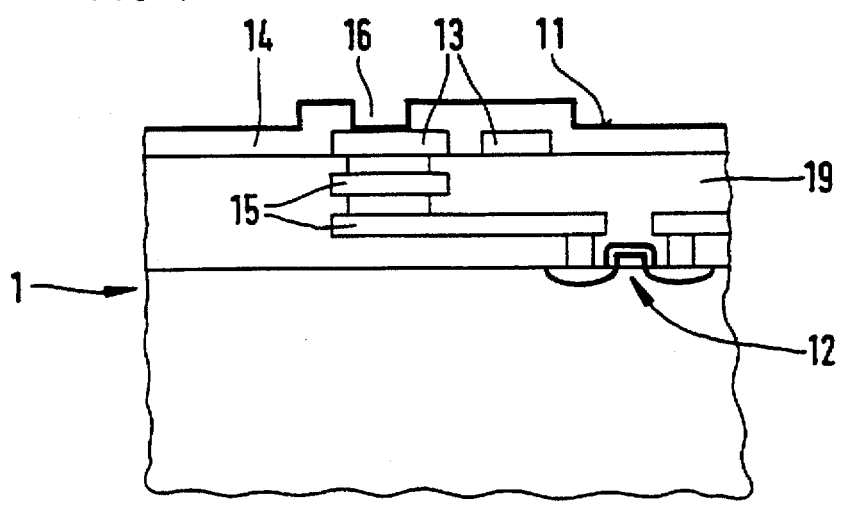
FIG. 1 is a cross section of a first substrate with circuit structures and metallization planes.

A first substrate 1 made, for example, of monocrystalline silicon comprises, in the region of a first main area 11, a first circuit structure 12, for example an MOS transistor, and a first metallization plane 13. The first metallization plane 13 is covered by a first passivation layer 14 made, for example, of SiO2/Si3N4. Under the first metallization plane 13, the first substrate 1 comprises further metallization planes 15, which are surrounded by an oxide layer 19. The first metallization plane 13 is composed, for example, of aluminum or an aluminum alloy. Below the first circuit structure 12, the first substrate 1 has an extent of, for example, 625 μm perpendicular to the first main area 11. A first contact hole 16 has been opened in the first passivation layer 14 and reaches the surface of the first metallization plane 13 (see FIG. 1).

Figure 2:
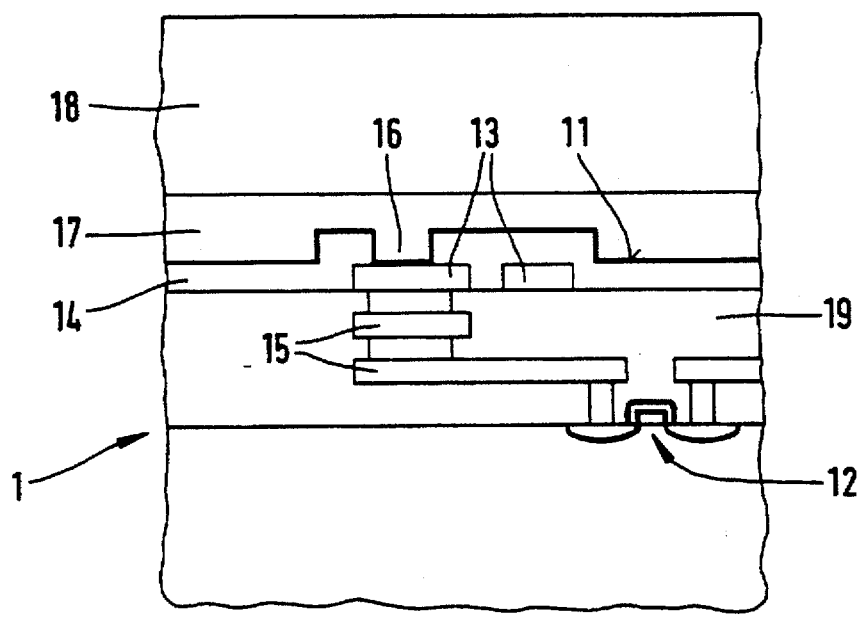
FIG. 2 is a cross section of the first substrate with a first adhesion layer and an auxiliary substrate.

In FIG. 2, a first adhesion layer 17 made, for example, of polyimide or polyacrylate is applied over the whole area to the first main area 11, that is to say to the surface of the first passivation layer 14. The first adhesion layer 17 is applied to a thickness of, for example, 1.5 μm. An auxiliary substrate 18 is bonded onto the first adhesion layer 17. An Si wafer, for example, is suitable as the auxiliary substrate 18. The auxiliary substrate 18 is used as a handling wafer or handling chip and protects the first main area 11 during further processing of the first substrate (see FIG. 2).

The first substrate 1 is thinned by grinding or etching from a second main area, opposite to the first main area 11, until the thickness of the substrate perpendicular to the first main area 11 below the circuit structure 12 has a residual thickness of a few μm, preferably 5 μm.

Figure 3:
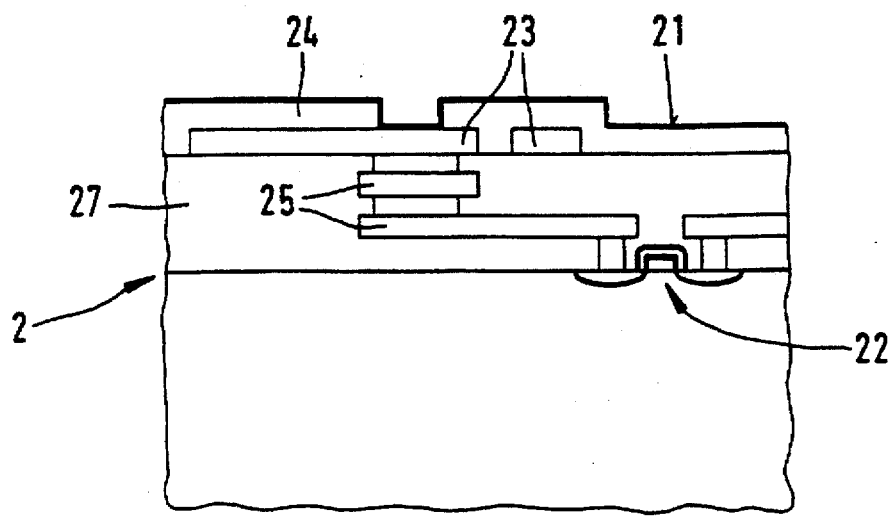
FIG. 3 is a cross section of a second substrate with circuit structures and metallization planes.

In FIG. 3, a second substrate 2 is composed, for example, of monocrystalline silicon and comprises, in the region of a third main area 21, at least one circuit structure 22, for example an MOS transistor, and a second metallization plane 23. The second metallization plane 23 is covered by a passivation layer made, for example, of SiO2/Si3N4. Under the second metallization plane, the substrate 2 comprises further metallization planes 25, which are surrounded, for example, by an oxide layer 27. The second metallization plane 23 is composed, for example, of aluminum or an aluminum alloy (see FIG. 3).

Figure 4:
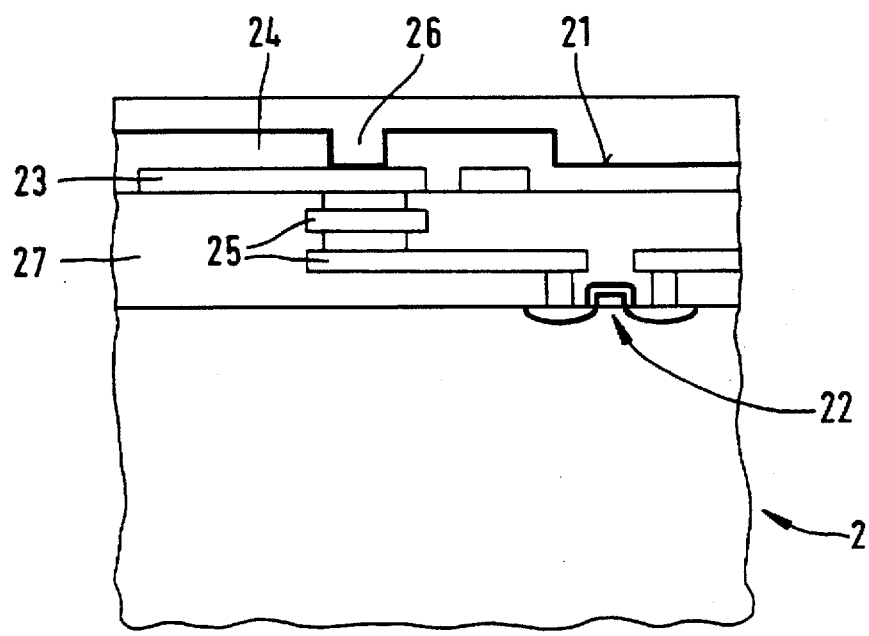
FIG. 4 is a cross section of the second substrate with a second adhesion layer.
Figure 5:
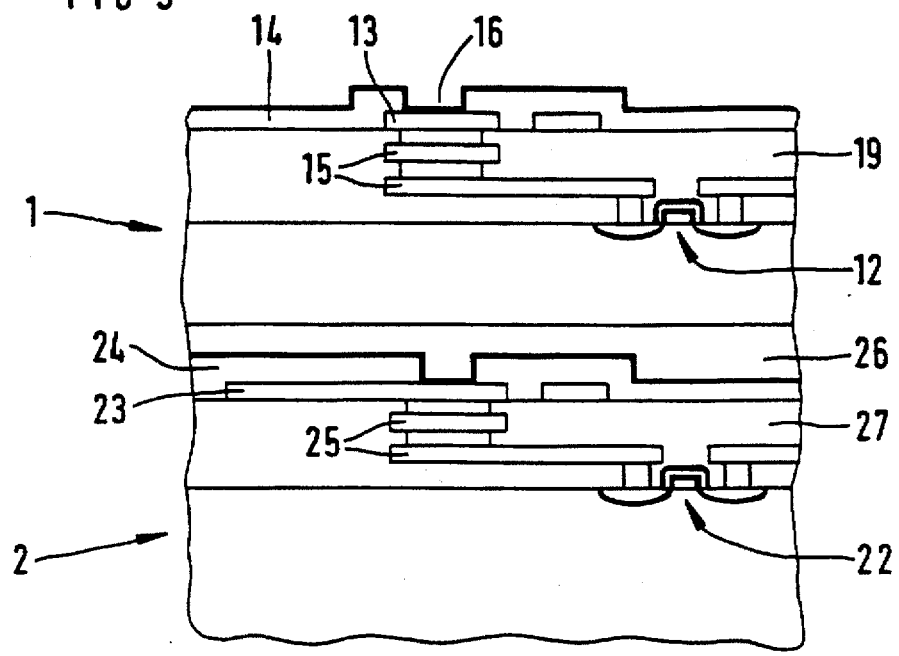
FIG. 5 is a cross section of the first substrate and the second substrate after the first substrate has been thinned by grinding and the two substrates have been joined together.

A second adhesion layer 26 made, for example, of polyimide is applied (see FIG. 4) over the whole area to the third main area 21, that is to say to the surface of the second passivation layer 24. The thinned first substrate 1 is subsequently joined together with the second substrate 2. In this case, the second main area, opposite to the first main area 11, is applied to the surface of the second adhesion layer 26. The first substrate 1 and the second substrate 2 are precisely aligned relative to one another as shown in FIG. 5 preferably by means of alignment marks on the first substrate 1 and the second substrate 2 as is known using infrared light transmitted through the substrates. After the first substrate 1 and the second substrate 2 have been joined together, the second adhesion layer 26 is subjected to an aftertreatment, thereby producing a fixed connection between the first substrate 1 and the second substrate 2. The aftertreatment comprises, for example, the polymerization of the polyimide.

The auxiliary substrate 18 shown in FIG. 2 is subsequently removed, for example by being etched away. The first adhesion layer 17 which is then exposed is removed over the whole area, for example using an oxygen plasma or a solvent yielding the structure of FIG. 5. The first contact hole 16 to the first metallization plane 13 in the first passivation layer 14 is also opened in the process.

Figure 6:
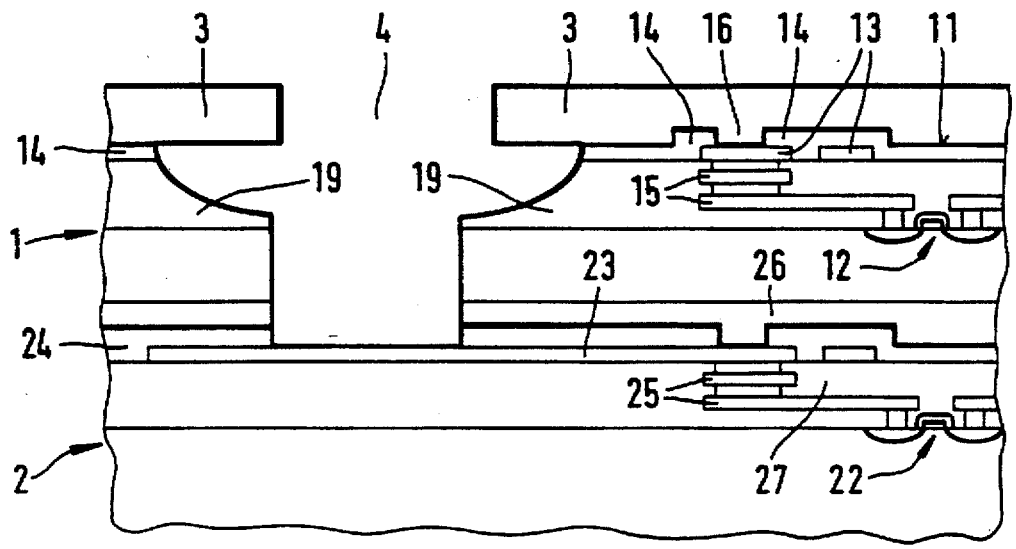
FIG. 6 is a cross section of the first substrate and the second substrate after the opening of a second contact hole which reaches a metallization plane of the second substrate.
Figure 7:
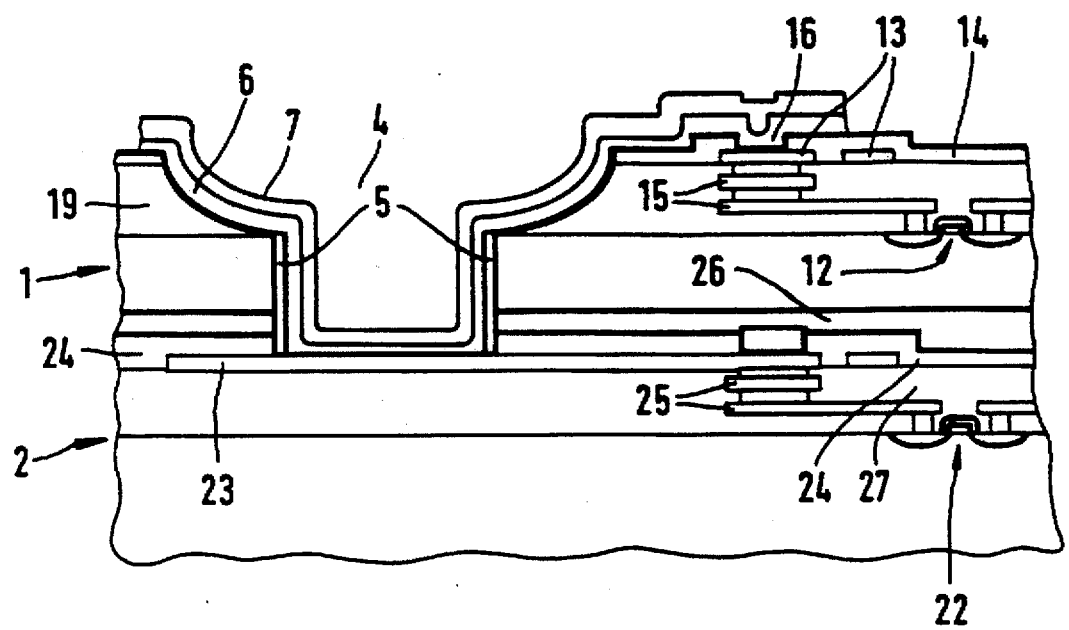
FIG. 7 is a cross section of the first substrate and the second substrate after the production of side insulation and after the production of a conductive layer.

In FIG. 6, a photoresist mask 3 which defines the position of a second contact hole 4 is produced. The second contact hole 4 is then opened in a combined etching process. For this purpose, the first passivation layer 14 and the oxide layer 19 surrounding the further metallization planes 15 are first of all etched in an isotropic etching process using, for example, HNO3/HF. In an anisotropic etching process, for example using an HBr plasma, the silicon of the first substrate 1, the second adhesion layer 26 and the second passivation layer 24 are then etched through until the second contact hole 4 reaches the second metallization plane 23 (see FIG. 6). In FIG. 2, after the removal of the photoresist mask 3 and performing appropriate cleaning steps, an insulating layer having an essentially conforming edge covering, for example an oxide, is deposited. Side insulation 5 is produced from the insulating layer with the aid of a further photographic technique or, preferably, in a self-aligning manner using a spacer technique, which side insulation covers the exposed silicon on the side walls of the second contact hole 4 (see FIG. 7).

A diffusion barrier layer 6 made, for example, of Ti/TiN is then applied and, on top of this, a conductive layer 7 made, for example, of aluminum or CVD tungsten. The conductive layer 7 and the diffusion barrier layer 6, which is likewise conductive, cover both that surface of the second metallization plane 23 which is exposed in the second contact hole 4 and that surface of the first metallization plane 13 which is exposed in the first contact hole 16. The first metallization plane 13 and the second metallization plane 23 are therefore electrically connected to one another via the diffusion barrier 6 and the conductive layer 7. The diffusion barrier layer 6 and the conductive layer 7 are subsequently structured. The structured conductive layer 7 constitutes a vertical electrical connection between the first substrate 1 and the second substrate 2 (see FIG. 7).

Finally, another further passivation layer made, for example, of SiO2 is applied to the structure, in which layer connection areas (bonding areas) are opened to the conductive layer 7 and/or other metallization planes.

The use of an isotropic etching process to etch the first passivation layer 14 and the oxide results in the second contact hole having a relatively large cross section 4. This embodiment of the invention is therefore suitable for a relatively rough interconnection grid.

Figure 8:
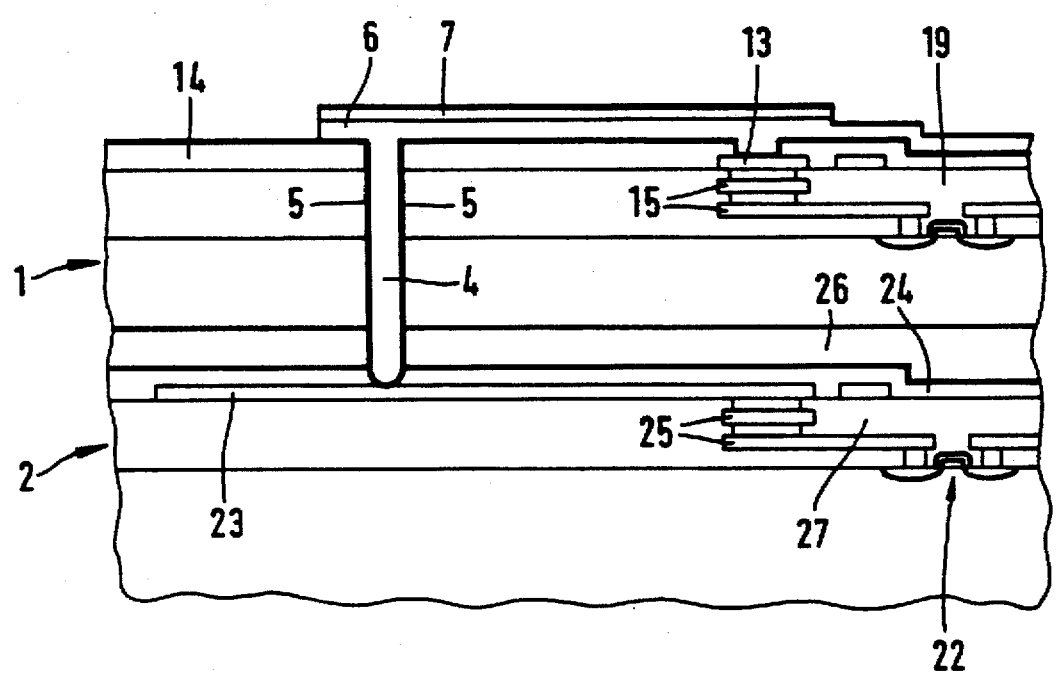
FIG. 8 is a cross section of the first substrate and the second substrate with a second contact hole which reaches a metallization plane of the second substrate and has been opened using an anisotropic etching process.

As an alternative, taking the structure shown in FIG. 5 as a basis, the second contact hole 4 can be formed in an anisotropic etching process. The etching is preferably carried out with the aid of a CHF3 and HBr plasma. In this case, the contact hole 4 is formed with a much more extreme aspect ratio (that is the ratio of the cross section to the depth of the contact hole) (see FIG. 8). Aspect ratios of up to 1:20 can be achieved in this etching process. This embodiment of the invention is preferably used for fine interconnection grids. Side insulation 5 is produced along the side walls of the second contact hole 4 in this embodiment of the invention, too. For this purpose, for example using an ozone TEOS method, an SiO2 layer having an essentially conforming edge covering is deposited and is subsequently anisotropically etched until the surface of the second metallization plane 23 is exposed. The second contact hole is subsequently filled with the diffusion barrier layer 6 and the conductive layer 7 (see FIG. 8). In this case, the diffusion barrier layer 6 and the conductive layer 7 are formed from CVD TiN and CVD W, for example.

The first contact hole 16 can be opened before the joining together of the first substrate 1 and the second substrate 2, as described in the exemplary embodiment, or after the joining together of the first substrate 1 and the second substrate 2. The first contact hole 16, which reaches the first metallization plane 13, must be opened prior to the deposition of the diffusion barrier layer 6 and the conductive layer 7.

Although other modifications and changes may be suggested by those skilled in the art, it is the intention of the inventor to embody within the patent warranted hereon all changes and modifications as reasonably and properly come within the scope of his contribution to the art.

We claim:

1. A method for producing a three-dimensional circuit arrangement, comprising the steps of:

connecting a first substrate, which comprises, in a region of a first main area, at least one first circuit structure, a first metallization plane and a first passivation layer which covers said first metallization plane, to an auxiliary substrate via a first adhesion layer which is applied to said first main area, thinning said first substrate at a second main area opposite to said first main area, providing a second substrate, which comprises, in a region of a third main area, at least one second circuit structure, a second metallization plane and a second passivation layer which covers said second metallization plane, with a second adhesion layer on said third main area, joining said first substrate and said second substrate together in such a way that said second main area of said first substrate adjoins said second adhesion layer on said second substrate, and that said first substrate and said second substrate are fixedly connected via said second adhesion layer, opening a first contact hole from said first main area to said first metallization plane, opening, after removal of said auxiliary substrate and of said first adhesion layer, at least one second contact hole to said second metallization plane starting from said first main area, said opening step of said at least one second contact hole including etching said at least one second contact hole through material of said first substrate, said opening step of said at least one second contact hole being performed after said joining step, producing a conductive layer on said first main area and electrically connecting said first metallization plane and said second metallization plane to one another.

2. A method as claimed in claim 1, further comprising the step of:

producing side insulation on side walls of at least said second contact hole prior to production of conductive layer.

3. A method as claimed in claim 1, further comprising the steps of:

providing said first substrate and said second substrate with alignment marks; and aligning said first and second substrates with one another using infrared transmitted light when said first substrate and said second substrate are joined together.

4. A method as claimed in claim 1, further comprising the step of:

thinning said first substrate by grinding.

5. A method as claimed in claim 4, wherein at least said first substrate is an SOI substrate which comprises a monocrystalline silicon layer, a buried oxide layer and a silicon wafer, and further comprising the steps of:

removing said silicon wafer during thinning of said first substrate, establishing said first circuit structure in said monocrystalline silicon layer of said SOI substrate.

6. A method as claimed in claim 1, further comprising the step of:

applying a further passivation layer to a whole area of said conductive layer.

7. A method as claimed in claim 1, further comprising the step of;

providing further metallization planes in said first substrate, under said first metallization plane.

8. A method as claimed in claim 1, wherein said first adhesion layer comprises an adhesive selected from the group consisting of a polyimide adhesive and a polyacrylate adhesive and wherein said first adhesiveU is removed by a removal method selected from $O_2$ plasma methods or wet-chemical removal methods.

9. A method as claimed in one of claim 1, wherein said second adhesion layer is a polyimide adhesive which is cured by polymerization after said first substrate and said second substrate have been joined together.

10. A method as claimed in claim 1, wherein said second contact hole is opened using combined etching which comprises at least isotropic etching using HNO3/HF and anisotropic etching using an HBr plasma.

11. A method as claimed in claim 1, wherein said second contact hole is opened using anisotropic etching using CHF3 and HBr plasmas.

12. A method as claimed in claim 1, further comprising the step of:

thinning said first substrate by etching.

13. A method as claimed in claim 1, further comprising the step of;

providing further metallization planes in said second substrate under said second metallization plane.

14. A method for producing a three-dimensional circuit arrangement, comprising the steps of:

connecting a first substrate of silicon, which comprises, in a region of a first main area, at least one first circuit structure, a first metallization plane and a first passivation layer which covers said first metallization plane, to an auxiliary substrate via a first adhesion layer which is applied to said first main area, thinning said first substrate at a second main area opposite to said first main area, providing a second substrate of silicon, which comprises, in a region of a third main area, at least one second circuit structure, a second metallization plane and a second passivation layer which covers said second metallization plane, with a second adhesion layer on said third main area, joining said first substrate and said second substrate together in such a way that said second main area of said first substrate adjoins said second adhesion layer on said second substrate, and that said first substrate and said second substrate are fixedly connected via said second adhesion layer, opening a first contact hole from said first main area to said first metallization plane, opening, after removal of said auxiliary substrate and of said first adhesion layer, at least one second contact hole to said second metallization plane starting from said first main area, said opening step of said at least one second contact hole including etching said at least one second contact hole through material of said first substrate, said opening step of said at least one second contact hole being performed after said joining step, producing a conductive layer on said first main area and electrically connecting said first metallization plane and said second metallization plane to one another.

15. A method as claimed in claim 14, further comprising the step of:

producing side insulation on side walls of at least said second contact hole prior to production of conductive layer.

16. A method as claimed in claim 14, further comprising the steps of:

providing said first substrate and said second substrate with alignment marks; and aligning said first and second substrates with one another using infrared transmitted light when said first substrate and said second substrate are joined together.

17. A method as claimed in claim 14, further comprising the step of:

thinning said first substrate by grinding.

18. A method as claimed in claim 17, wherein at least said first substrate is an SOI substrate which comprises a monocrystalline silicon layer, a buried $SiO2$ layer and a silicon wafer, and further comprising the steps of:

removing said silicon wafer during thinning of said first substrate, establishing said first circuit structure in said monocrystalline silicon layer of said SOI substrate.

19. A method as claimed in claim 14, further comprising the step of:

applying a further passivation layer to a whole area of said conductive layer.

20. A method as claimed in claim 14, further comprising the step of:

providing further metallization planes in said first substrate, under said first metallization plane.

21. A method as claimed in claim 14, wherein said first adhesion layer comprises an adhesive selected from the group consisting of a polyimide adhesive and a polyacrylate adhesive and wherein said first adhesive is removed by a removal method selected from $O_2$ plasma methods or wet-chemical removal methods.

22. A method as claimed in one of claim 14, wherein said second adhesion layer is a polyimide adhesive which is cured by polymerization after said first substrate and said second substrate have been joined together.

23. A method as claimed in claim 14, wherein said second contact hole is opened using combined etching which comprises at least isotropic etching using $HNO_3/HF$ and anisotropic etching using an HBr plasma.

24. A method as claimed in claim 14, wherein said second contact hole is opened using anisotropic etching using $CHF_3$ and HBr plasmas.

25. A method as claimed in claim 14, further comprising the step of:
   thinning said first substrate by etching.

26. A method as claimed in claim 14, further comprising the step of:
   providing further metallization planes in said second substrate under said second metallization plane.

* * * * *